(12) United States Patent
Lambert et al.

(10) Patent No.: US 10,564,218 B2
(45) Date of Patent: Feb. 18, 2020

(54) SYSTEMS AND METHODS FOR DEBUGGING ACCESS

(71) Applicant: Dell Products L.P., Round Rock, TX (US)

(72) Inventors: Timothy M. Lambert, Austin, TX (US); Jeffrey Kennedy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 117 days.

(21) Appl. No.: 15/803,249

(22) Filed: Nov. 3, 2017

(65) Prior Publication Data

US 2019/0137567 A1    May 9, 2019

(51) Int. Cl.
| | |
|---|---|
| *G06F 11/36* | (2006.01) |
| *G01R 31/317* | (2006.01) |
| *G06F 11/07* | (2006.01) |
| *G06F 13/14* | (2006.01) |

(52) U.S. Cl.
CPC ........ *G01R 31/31705* (2013.01); *G06F 11/07* (2013.01); *G06F 11/0784* (2013.01); *G06F 11/3652* (2013.01); *G06F 11/3656* (2013.01); *G06F 13/14* (2013.01)

(58) Field of Classification Search
CPC ............. G06F 11/3652; G06F 11/3656; G06F 11/3648; G06F 11/07; G01R 31/31705
See application file for complete search history.

(56) References Cited

U.S. PATENT DOCUMENTS

| | | | |
|---|---|---|---|
| 6,515,994 B1 | 2/2003 | Chuah | |
| 9,477,260 B2 | 10/2016 | Hartman et al. | |
| 2007/0198634 A1 | 8/2007 | Knowles et al. | |
| 2009/0217079 A1* | 8/2009 | Liu ....................... | G06F 9/4416 714/4.11 |
| 2010/0070563 A1 | 3/2010 | Baker et al. | |
| 2010/0153807 A1 | 6/2010 | Kakani | |
| 2011/0080703 A1 | 4/2011 | Schlesener et al. | |
| 2013/0247033 A1 | 9/2013 | Sawhney et al. | |
| 2014/0181891 A1 | 6/2014 | Von Bokern et al. | |
| 2014/0207902 A1 | 7/2014 | Joshi et al. | |
| 2015/0024697 A1 | 1/2015 | Holtman | |
| 2015/0222517 A1 | 8/2015 | McLaughlin et al. | |
| 2016/0091871 A1 | 3/2016 | Marti et al. | |
| 2016/0261455 A1* | 9/2016 | Su ......................... | H04L 41/069 |
| 2017/0115350 A1* | 4/2017 | Zhang .............. | G01R 31/1705 |
| 2017/0322867 A1* | 11/2017 | Jiao .................... | G06F 11/3648 |
| 2018/0038908 A1* | 2/2018 | Reiss ............... | G01R 31/31705 |

* cited by examiner

*Primary Examiner* — Yolanda L Wilson
(74) *Attorney, Agent, or Firm* — Jackson Walker L.L.P.

(57) ABSTRACT

In accordance with embodiments of the present disclosure, an information handling system may include a host system with information handling resources, a management controller configured to provide out-of-band management of the information handling system, and a debugging circuit. The debugging circuit may receive a plurality of serial data streams from the management controller and the plurality of information handling resources, and provide access to at least a subset of the plurality of serial data streams to a debugging information handling system via a wireless interface.

38 Claims, 2 Drawing Sheets

SYSTEMS AND METHODS FOR DEBUGGING ACCESS

TECHNICAL FIELD

The present disclosure relates in general to information handling systems. More particularly this disclosure relates to methods and systems for accessing information handling resources and systems, for example in a debugging context.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Even though many newer technologies are now available, serial ports (e.g., RS-232 ports using DB-9 connectors) remain a common and flexible method for establishing local bidirectional interaction from a debugging information handling system (e.g., a client system such as a laptop, phone, tablet, PDA etc.) to various subsystems of an information handling system (e.g., a server system). For example, information handling resources such as management controllers, machine control units (MCUs), programmable logic devices (PLDs) including complex programmable logic devices (CPLDs), field-programmable gate arrays (FPGAs) basic input/output systems (BIOSes), platform security processors, pre-boot environments, operating system (OSes), storage controllers, PCIe managers, etc. may be accessed in such a manner. Such access may be particularly advantageous for debugging problems that may arise with such information handling resources. Such access may further be useful during development, manufacturing, or at other times.

Traditional physical serial ports, however, are often available only in inconvenient locations at the back of servers. Usage of such physical serial ports has, due in part to the expense of serial concentrators and the existence of alternatives such as serial over LAN. Momentary use of such ports often requires being in the uncomfortable "hot aisle," physical manipulation of cable management devices, a laptop USB to DB-9 dongle, and an old-fashioned serial cable. Further, some servers and other information handling systems may not even include a serial port.

A typical physical serial port on a server may be able to access only one serial stream, whereas it may be desirable to enable user selection from among many concurrent serial streams within different server subsystems.

To partially mitigate the drawbacks of using traditional serial ports, expensive onboard diagnostic LEDs are sometimes included in devices to diagnose lower-level undesired operation. Embodiments of this disclosure may provide access to low-level field service, manufacturing, and/or debugging capabilities without the need for such diagnostic LEDs. According to various embodiments, mobile devices (e.g., phones, tablets, laptops, etc.) or other information handling systems may be able to access various serial data streams without the need for a physical connection to a server serial port.

Some mobile devices such as phones or tablets are typically configured to run only one terminal emulator application at a time, and such a terminal emulator application may be configured to interact with only one serial stream at a time. Accordingly, some embodiments of this disclosure allow the use of a "break sequence" in a terminal program to select among the various available UART channels. Further, a terminal program on a more full-featured computer system such as a laptop may be configured to access a plurality of available serial streams concurrently.

According to various embodiments of this disclosure, many disadvantages of existing solutions may be mitigated or eliminated. For example, access to various information handling resources from the "cold aisle" of a server room may be possible in either a wired or a wireless fashion.

It should be noted that the discussion of any element as "background" or the like is not intended to create an admission of prior-art status as to that element. Unless clearly labeled as "prior art," nothing in this disclosure is intended to create such an admission.

SUMMARY

In accordance with the teachings of the present disclosure, many disadvantages and problems associated with providing debugging access to information handling resources may be reduced or eliminated.

In accordance with embodiments of the present disclosure, an information handling system may include a host system including at least one processor, a plurality of information handling resources, a management controller configured to provide out-of-band management of the information handling system, and a debugging circuit coupled to the management controller. The debugging circuit may be configured to receive a plurality of serial data streams from the management controller and the plurality of information handling resources, and provide access to at least a subset of the plurality of serial data streams to a debugging information handling system via a wireless interface.

In accordance with these and other embodiments, a method may include receiving, at a debugging circuit of an information handling system, a plurality of serial data streams, wherein the plurality of serial data streams are received from a management controller configured to provide out-of-band management of the information handling system and from a plurality of information handling resources of at least one host system of the information handling system. The method may further include the debugging circuit providing access to at least a subset of the plurality of serial data streams to a debugging information handling system via a wireless interface.

In accordance with these and other embodiments, a debugging apparatus may include a debugging circuit and a wireless interface. The debugging circuit may be configured to couple to a management controller of an information handling system that is configured to provide out-of-band management of the information handling system; the information handling system may include at least one host system. The debugging circuit may be configured to receive a plurality of serial data streams from the management controller and from a plurality of information handling resources of the host system, and may be further configured to provide access to at least a subset of the plurality of serial data streams to a debugging information handling system via the wireless interface.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
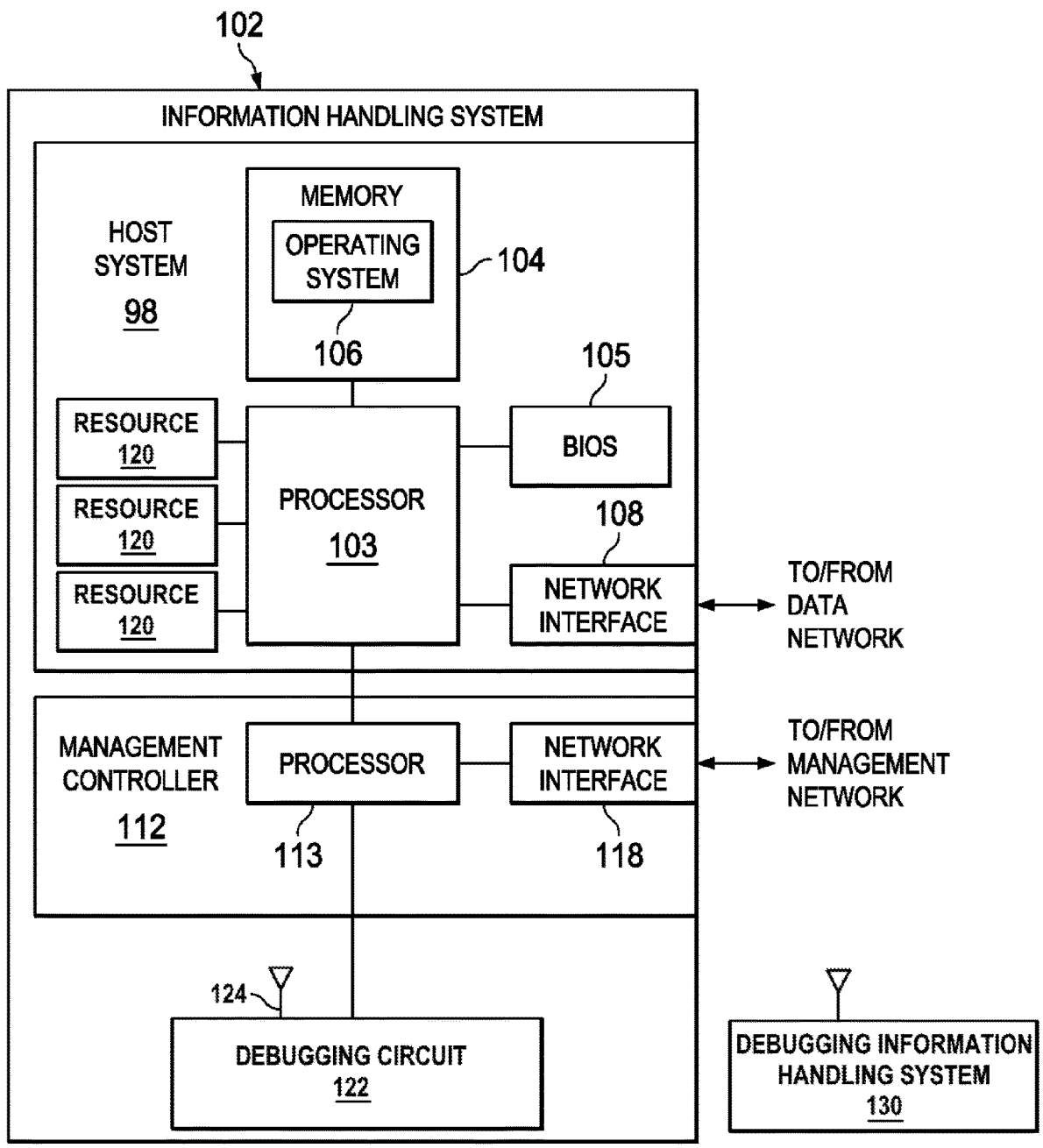
FIG. 1 illustrates a block diagram of an example information handling system, in accordance with embodiments of the present disclosure.
Figure 2:
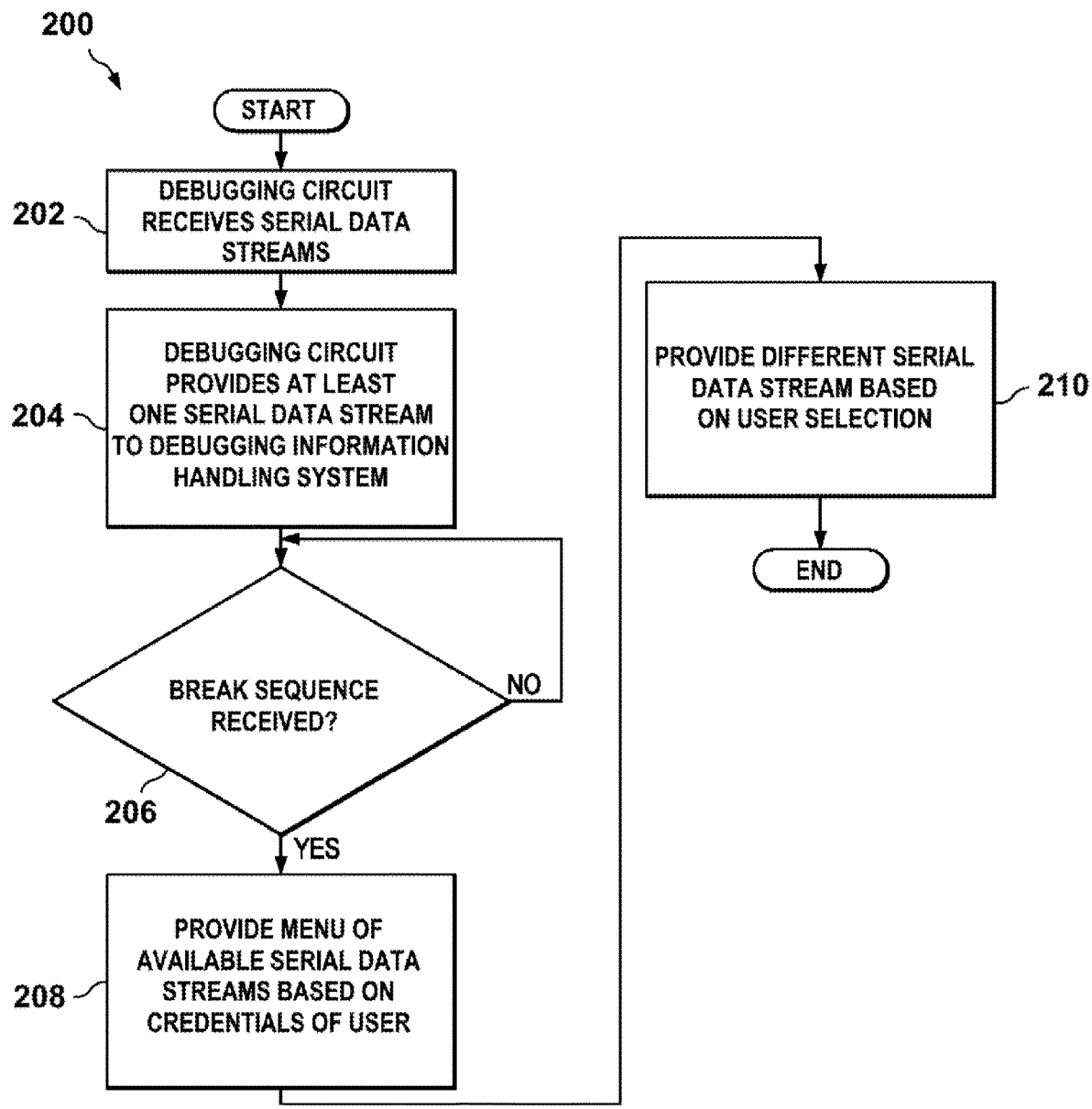
FIG. 2 illustrates a flow chart of an example method for providing debugging access, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media (e.g., transitory or non-transitory computer-readable media) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

As used herein, when two or more elements are referred to as "coupled" to one another, such term indicates that such two or more elements are in electronic communication or mechanical communication, as applicable, whether connected indirectly or directly, with or without intervening elements.

For the purposes of this disclosure, a serial port (and related terms such as serial connection, serial data stream, etc.) refers to a serial communications interface operable to transfer information one bit at a time. For example, an interface such as a COM port is an example of a serial port, as is any interface compliant with the RS-232 standard. Many serial ports include or are based on a universal asynchronous receiver-transmitter (UART) device. In some embodiments, terminal emulator programs may be used to interact with a serial data stream, with or without the use of a physical serial port.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102. In some embodiments, information handling system 102 may comprise a personal computer. In some embodiments, information handling system 102 may comprise or be an integral part of a server. In other embodiments, information handling system 102 may comprise a portable information handling system (e.g., a laptop, notebook, tablet, handheld, smart phone, personal digital assistant, etc.). As depicted in FIG. 1, information handling system 102 may include a processor 103, a memory 104 communicatively coupled to processor 103, a BIOS 105 communicatively coupled to processor 103, a network interface 108 communicatively coupled to processor 103, and a management controller 112 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions, or aggregation of programs of executable instructions, configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

A BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102.

Network interface 108 may comprise any suitable system, apparatus, or device operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

In operation, processor 103, memory 104, BIOS 105, and network interface 108 may comprise at least a portion of a host system 98 of information handling system 102.

Host system 98 may further include various other information handling resources, shown generally as resources 120. One of ordinary skill in the art with the benefit of this disclosure will understand that the illustration of three such resources 120 is merely exemplary in nature, and any desired number may be present in particular embodiments. Resources 120 may include elements such as machine control units (MCUs), programmable logic devices (PLDs) including complex programmable logic devices (CPLDs), platform security processors, devices providing pre-boot environments, or any other information handling resources. In particular, resources 120 may be configured to communicate via respective serial data streams in some instances. For example, debugging information relevant to the operation of resources 120, hardware output events, hardware states, test modes, or access to commands may be made available via serial data streams. In some embodiments, a particular resource 120 may produce multiple serial data streams for different purposes, such for as access to memory maps, POST codes, read/write traps, etc.

Management controller 112 may be configured to provide management facilities for management of information handling system 102. Such management may be made by management controller 112 even if information handling system 102 and/or host system 98 are powered off or powered to a standby state. Management controller 112 may include a processor 113, memory, and a management network interface 118 separate from and physically isolated from data network interface 108. In certain embodiments, management controller 112 may include or may be an integral part of a baseboard management controller (BMC), a chassis management controller (CMC), or a remote access controller (e.g., a Dell Remote Access Controller or Integrated Dell Remote Access Controller). As shown in FIG. 1, management controller 112 may comprise a processor 113 and a network interface 118 communicatively coupled to processor 113.

Processor 113 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 113 may interpret and/or execute program instructions and/or process data stored in a memory and/or another component of information handling system 102 or management controller 112. As shown in FIG. 1, processor 113 may be communicatively coupled to processor 103. Such coupling may be via a Universal Serial Bus (USB), System Management Bus (SMBus), and/or one or more other communications channels.

Network interface 118 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC."

Information handling system 102 may further include debugging circuit 122, which may be implemented through the use of any of various types of circuitry in particular embodiments. For example, in some cases, debugging circuit 122 may be implemented as a CPLD device, an FPGA device, an ASIC, etc. Debugging circuit 122 may also include antenna 124 for communicating wirelessly (e.g., via Bluetooth, BLE, or any other desired wireless technology) with debugging information handling system 130. Debugging information handling system 130 (or some other information handling system usable for debugging) may also in some embodiments be coupled to debugging circuit 122 via a wired connection such as a USB connection.

Debugging circuit 122 may receive serial data streams (e.g., unidirectional or bidirectional serial data streams) from any or all of the various information handling resources of information handling system 102 that are configured to communicate by serial data stream. For example, such serial data streams may include debugging information that may be useful if an information handling resource has partially or wholly malfunctioned.

In some embodiments, some or all of the serial data streams communicated to debugging circuit 122 may require authentication before being accessible to debugging information handling system 130. Thus, authentication data may be requested from debugging information handling system 130 before access to such serial data streams is granted. For example, management controller 112 may have one serial data stream (an unsecured stream) that does not require authenticated access, but another stream (a secured stream) that does require authenticated access. In some embodiments, authentication data may correspond to a user of debugging information handling system 130, and in other embodiments it may correspond to debugging information handling system 130 itself. For example, authentication data may include a username/password combination, a certificate, etc. Authenticated serial data streams may provide access to particularly sensitive functionality, such as the ability to upload firmware updates via serial connection. Thus based on the authentication information, a particular subset of the available serial data streams (e.g., the streams to which the authenticated user has been granted access) may be provided.

According to some embodiments, debugging circuit 122 may be powered by an auxiliary power source of information handling system 102. Such an arrangement may advantageously allow debugging circuit 122 to function even when other parts of information handling system 102 (e.g., host system 98 and/or management controller 112 and/or the main power rails) are wholly or partially non-functional.

In some embodiments, some or all of the serial data streams from management controller 112 and host system 98 may be multiplexed before being communicated to debugging circuit 122. For example, a host user serial data stream may originate in host system 98, be communicated to management controller 112, and be multiplexed therein before being communicated to debugging circuit 122. In some embodiments, some or all of resources 120 may be coupled directly to debugging circuit 122; in other embodiments, they may be coupled thereto via management controller 112; in yet other embodiments, they may be coupled thereto via both of host system 98 and management controller 112.

According to some embodiments, a plurality of multiplexers may be used. For example, a first level multiplexer may reside within an MCU and may be operable to bridge a single serial data stream to a debugging information handling system, or to concurrently bridge a plurality of concurrent serial data streams to individual terminal consoles on a debugging information handling system.

In these and other embodiments, different types of second level multiplexers may be employed. For example, such a second level multiplexer may be a component of management controller 112 and may be operable to route user and/or debug serial data streams from management controller 112, as well as a host serial data stream from host system 98. Alternatively or in addition, a second level multiplexer may be a component of a CPLD and may be operable to act as a serial concentrator for other sources of serial data streams and/or from its own internal producer(s) of diagnostic serial data streams.

According to some embodiments, debugging circuit 122 may have a plurality of serial data streams available, but debugging information handling system 130 may be operable to handle only one at a time. In such an embodiment, a user of debugging information handling system 130 may use a terminal emulator program to send a break sequence (e.g., one or more special and/or non-printable characters) to debugging circuit 122. Upon receipt of such a break sequence, debugging circuit 122 may take appropriate action (e.g., transmitting a menu of available serial data streams for display and selection within the terminal emulator). In some embodiments, the specific serial data streams made available via such a menu may depend upon the identity and/or authentication credentials of the user of debugging information handling system 130.

In some embodiments, trigger events may cause debugging circuit 122 to provide a particular data stream (e.g., to begin providing a serial data stream, or to switch from one serial data stream to another). Trigger events may be configured in any desired manner, but some examples may include failure of main power, failure of auxiliary power, secure boot failure, timeouts associated with management controller 112, and/or other anomalous events.

In some embodiments, debugging circuit 122 may be configured to automatically begin transmitting a particular serial data stream in response to such a trigger event. For example, in response to a detection of a power fault, a low-level debugging serial data stream (e.g., from a power supply unit or from management controller 112) may be automatically provided.

As discussed above, several examples of so-called "one-to-many" arrangements of serial data streams may be possible according to this disclosure. That is, one debugging information handling system 130 may be in communication with many serial data streams (e.g., either concurrently via separate terminal emulator windows or non-concurrently via break sequences and menus). According to some embodiments, "many-to-many" arrangements of serial data streams may also be utilized. For example, a plurality of debugging information handling systems 130 may each communicate with one or more serial data streams via debugging circuit 122, and the particular serial data streams available to each need not be identical. Further, in some embodiments, a debugging information handling system 130 may access serial data streams via a wired connection such as a UART-USB bridge, which may be located on a front portion of information handling system 102.

In addition to the elements shown, information handling system 102 may include one or more other information handling resources. Further, although FIG. 1 depicts information handling system 102 as only having a single host system 98 for the purposes of clarity and exposition, in some embodiments, information handling system 102 may comprise a server rack including a plurality of racks of host systems 98. In such embodiments, information handling resources from a plurality of such racks of host systems 98 may all be communicated to debugging circuit 122 in the manners described above, as will be readily understood by one of ordinary skill in the art with the benefit of this disclosure.

Turning now to FIG. 2, a flow chart of an example method 200 for providing debugging information from elements of an information handling system is shown, in accordance with certain embodiments of the present disclosure. According to some embodiments, method 200 may begin at step 202. As noted above, teachings of the present disclosure may be implemented in a variety of configurations of information handling system 102.

At step 202, a debugging circuit receives one or more serial data streams. Various possibilities for the source(s) of such serial data streams have been discussed above. One of ordinary skill in the art with the benefit of this disclosure will recognize other possibilities that are also within the scope of this disclosure.

At step 204, the debugging circuit provides at least one of such serial data streams to a debugging information handling system. As discussed above, the connection to the debugging information handling system may be wired or wireless in various embodiments.

At step 206, the debugging circuit checks to see if a break sequence has been received. If no such break sequence has been received, the debugging circuit continues to allow interaction between the debugging information handling system and the original serial data stream, while continuing to monitor for a break sequence. If a break sequence has been received, the method proceeds to step 208.

At step 208, the debugging circuit may provide a menu to allow for selection of a different serial data stream. This menu may be provided to the debugging information handling system over the same connection through which the debugging information handling system has been accessing the original serial data stream (e.g., the menu may be displayed in a terminal emulator program or the like at the debugging information handling system).

At step 210, based on a selection of a serial data stream from the menu, the debugging circuit begins providing a different serial data stream to the debugging information handling system. Method 200 ends after step 210.

Although FIG. 2 discloses a particular number of steps to be taken with respect to method 200, method 200 may be executed with greater or lesser steps than those depicted in FIG. 2. In addition, although FIG. 2 discloses a certain order of steps to be taken with respect to method 200, the steps comprising method 200 may be completed in any suitable order.

Method 200 may be implemented using information handling system 102 or any other system operable to implement method 200. In certain embodiments, method 200 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
 a host system comprising at least one processor;
 a plurality of information handling resources coupled to the host system;
 a management controller communicatively coupled to the at least one processor and configured to provide out-of-band management of the information handling system; and
 a debugging circuit coupled to the management controller and configured to:
  receive a plurality of serial data streams from the management controller and the plurality of information handling resources;
  provide access to at least a subset of the plurality of serial data streams to a debugging information handling system via a wireless interface;
  detect a break sequence from the debugging information handling system; and
  in response to the break sequence, accept a selection of a particular one of the plurality of serial data streams from the debugging information handling system.

2. The information handling system of claim 1, wherein the providing access is in response to a fault condition of the information handling system.

3. The information handling system of claim 2, wherein the fault condition is associated with a particular one of the information handling resources coupled to the host system, and wherein the at least a subset includes a particular serial data stream associated with the particular information handling resource.

4. The information handling system of claim 2, wherein the fault condition is associated with the management controller, and wherein the at least a subset includes a particular serial data stream associated with the management controller.

5. The information handling system of claim 1, wherein the information handling system includes a plurality of host systems.

6. The information handling system of claim 1, wherein the wireless interface is a Bluetooth interface.

7. The information handling system of claim 1, wherein the debugging circuit is further configured to provide the access via a wired interface located on a front of the information handling system.

8. A method comprising:
 receiving, at a debugging circuit of an information handling system, a plurality of serial data streams, wherein the plurality of serial data streams are received from a management controller configured to provide out-of-band management of the information handling system and from a plurality of information handling resources of at least one host system of the information handling system;
 the debugging circuit providing access to at least a subset of the plurality of serial data streams to a debugging information handling system via a wireless interface;
 the debugging circuit detecting a break sequence from the debugging information handling system; and
 in response to the break sequence, the debugging circuit accepting a selection of a particular one of the plurality of serial data streams from the debugging information handling system.

9. The method of claim 8, wherein only one of the plurality of serial data streams is received from the management controller.

10. The method of claim 8, wherein the subset of the plurality of serial data streams is based at least in part on privileges of the debugging information handling system or on privileges of a user of the debugging information handling system.

11. The method of claim 8, wherein the providing is based at least in part on a trigger event from at least one of the information handling resources.

12. The method of claim 8, further comprising:
during access of a particular one of the plurality of serial data streams by the debugging information handling system, receiving an indication of a trigger event from the information handling system; and
in response to the trigger event, causing the debugging information handling system to access a different one of the plurality of serial data streams.

13. The method of claim 8, further comprising:
requesting authentication information from the debugging information handling system;
receiving the authentication information; and
in response to the received authentication information, providing access to a secured one of the plurality of serial data streams.

14. A debugging apparatus comprising:
a debugging circuit configured to couple to a management controller of an information handling system, the management controller being configured to provide out-of-band management of the information handling system, and the information handling system including at least one host system; and
a wireless interface;
wherein the debugging circuit is configured to receive a plurality of serial data streams from the management controller and from a plurality of information handling resources of the host system;
wherein the debugging circuit is further configured to provide access to at least a subset of the plurality of serial data streams to a debugging information handling system via the wireless interface; and
wherein the debugging circuit is further configured to detect a break sequence from the debugging information handling system, and in response to the break sequence, accept a selection of a particular one of the plurality of serial data streams from the debugging information handling system.

15. The debugging apparatus of claim 14, wherein the wireless interface includes an interface selected from the group consisting of Bluetooth and Bluetooth Low Energy (BLE).

16. The debugging apparatus of claim 14, wherein the debugging apparatus is further configured to receive an indication of a fault condition in a particular one of the information handling resources.

17. The debugging apparatus of claim 16, wherein the subset includes only the serial data stream corresponding to the particular information handling resource.

18. The debugging apparatus of claim 14, further comprising a wired interface configured to provide the access.

19. The debugging apparatus of claim 18, wherein the wired interface is a Universal Serial Bus (USB) interface.

20. An information handling system comprising:
a host system comprising at least one processor;
a plurality of information handling resources coupled to the host system;
a management controller communicatively coupled to the at least one processor and configured to provide out-of-band management of the information handling system; and
a debugging circuit coupled to the management controller and configured to:
receive a plurality of serial data streams from the management controller and the plurality of information handling resources; and
provide access to at least a subset of the plurality of serial data streams to a debugging information handling system via a wireless interface, wherein the subset of the plurality of serial data streams is based at least in part on privileges of the debugging information handling system or on privileges of a user of the debugging information handling system.

21. The information handling system of claim 20, wherein the providing access is in response to a fault condition of the information handling system.

22. The information handling system of claim 21, wherein the fault condition is associated with a particular one of the information handling resources coupled to the host system, and wherein the at least a subset includes a particular serial data stream associated with the particular information handling resource.

23. The information handling system of claim 21, wherein the fault condition is associated with the management controller, and wherein the at least a subset includes a particular serial data stream associated with the management controller.

24. The information handling system of claim 20, wherein the information handling system includes a plurality of host systems.

25. The information handling system of claim 20, wherein the wireless interface is a Bluetooth interface.

26. The information handling system of claim 20, wherein the debugging circuit is further configured to provide the access via a wired interface located on a front of the information handling system.

27. A method comprising:
receiving, at a debugging circuit of an information handling system, a plurality of serial data streams, wherein the plurality of serial data streams are received from a management controller configured to provide out-of-band management of the information handling system and from a plurality of information handling resources of at least one host system of the information handling system; and
the debugging circuit providing access to at least a subset of the plurality of serial data streams to a debugging information handling system via a wireless interface, wherein the subset of the plurality of serial data streams is based at least in part on privileges of the debugging information handling system or on privileges of a user of the debugging information handling system.

28. The method of claim 27, wherein only one of the plurality of serial data streams is received from the management controller.

29. The method of claim 27, further comprising:
detecting a break sequence from the debugging information handling system; and
in response to the break sequence, accepting a selection of a particular one of the plurality of serial data streams from the debugging information handling system.

30. The method of claim 27, wherein the providing is based at least in part on a trigger event from at least one of the information handling resources.

31. The method of claim 27, further comprising:
during access of a particular one of the plurality of serial data streams by the debugging information handling system, receiving an indication of a trigger event from the information handling system; and
in response to the trigger event, causing the debugging information handling system to access a different one of the plurality of serial data streams.

32. The method of claim 27, further comprising:
requesting authentication information from the debugging information handling system;
receiving the authentication information; and
in response to the received authentication information, providing access to a secured one of the plurality of serial data streams.

33. A debugging apparatus comprising:
a debugging circuit configured to couple to a management controller of an information handling system, the management controller being configured to provide out-of-band management of the information handling system, and the information handling system including at least one host system; and
a wireless interface;
wherein the debugging circuit is configured to receive a plurality of serial data streams from the management controller and from a plurality of information handling resources of the host system; and
wherein the debugging circuit is further configured to provide access to at least a subset of the plurality of serial data streams to a debugging information handling system via the wireless interface, wherein the subset of the plurality of serial data streams is based at least in part on privileges of the debugging information handling system or on privileges of a user of the debugging information handling system.

34. The debugging apparatus of claim 33, wherein the wireless interface includes an interface selected from the group consisting of Bluetooth and Bluetooth Low Energy (BLE).

35. The debugging apparatus of claim 33, wherein the debugging apparatus is further configured to receive an indication of a fault condition in a particular one of the information handling resources.

36. The debugging apparatus of claim 35, wherein the subset includes only the serial data stream corresponding to the particular information handling resource.

37. The debugging apparatus of claim 33, further comprising a wired interface configured to provide the access.

38. The debugging apparatus of claim 37, wherein the wired interface is a Universal Serial Bus (USB) interface.

* * * * *